(12) United States Patent  
Chiou et al.

(10) Patent No.: US 8,881,596 B2  
(45) Date of Patent: Nov. 11, 2014

(54) SEMICONDUCTOR SENSING DEVICE TO MINIMIZE THERMAL NOISE

(75) Inventors: Jen-Huang Albert Chiou, Libertyville, IL (US); Shiuh-Hui Steven Chen, Lake Zurich, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 524 days.

(21) Appl. No.: 13/361,475

(22) Filed: Jan. 30, 2012

(65) Prior Publication Data

US 2013/0192378 A1  Aug. 1, 2013

(51) Int. Cl.  
*G01L 9/06* (2006.01)  
*G01L 7/08* (2006.01)

(52) U.S. Cl.  
USPC .................. 73/721; 73/700; 73/715; 73/753; 361/283.4

(58) Field of Classification Search  
None  
See application file for complete search history.

(56) References Cited

U.S. PATENT DOCUMENTS

| 5,242,863 | A  | * | 9/1993 | Xiang-Zheng et al. | ......... 438/53 |
| 5,637,801 | A  |   | 6/1997 | Ichihashi | |
| 6,255,728 | B1 |   | 7/2001 | Nasiri et al. | |
| 7,354,786 | B2 | * | 4/2008 | Benzel et al. | ................... 438/50 |
| 7,786,581 | B2 |   | 8/2010 | Kang et al. | |
| 8,008,738 | B2 | * | 8/2011 | Villa et al. | ..................... 257/415 |
| 8,049,287 | B2 | * | 11/2011 | Combi et al. | ................. 257/416 |

* cited by examiner

*Primary Examiner* — Lisa Caputo  
*Assistant Examiner* — Jermaine Jenkins

(57) ABSTRACT

An MEMS pressure sensor is designed to reduce or eliminate thermal noise, such as temperature offset voltage output. The pressure sensor includes a pressure sensing element having a diaphragm, and a cavity formed as part of the pressure sensing element, where the cavity receives a fluid such that the diaphragm at least partially deflects. The pressure sensing element also includes a plurality of piezoresistors, which are operable to generate a signal based on the amount of deflection in the diaphragm. At least one trench is integrally formed as part of the pressure sensing element, and an adhesive connects the pressure sensing element to the at least one substrate such that at least a portion of the adhesive is attached to the trench and redistributes thermally induced stresses on the pressure sensing element such that the thermally induced noise is substantially eliminated.

25 Claims, 6 Drawing Sheets

SEMICONDUCTOR SENSING DEVICE TO MINIMIZE THERMAL NOISE

FIELD OF THE INVENTION

Embodiments of the invention relate to a microelectromechanical system (MEMS) pressure sensing element having a trench at the backside for reducing or eliminating the effect of thermally induced stresses or thermal noise, such as temperature offset voltage output.

BACKGROUND OF THE INVENTION

MEMS pressure sensors are generally known. One type of pressure sensor is a differential pressure sensor which includes a pressure sensing element made of silicon which is anodically bonded to a glass pedestal, and the glass pedestal is mounted to a housing substrate using an adhesive. Many differential pressure sensors are used in applications in which the sensors are exposed to varying temperatures. This causes the sensing element, the glass pedestal, the adhesive, and the housing substrate to expand and contract in response to the temperature changes.

The pressure sensing element includes four piezoresistors or resistors positioned in what is known as a ""Wheatstone Bridge"" configuration. The adhesive expands and contracts at a different rate in relation to the pressure sensing element, which can cause stress to be applied to the resistors, affecting the pressure reading detected by the pressure sensing element. The glass pedestal is incorporated between the pressure sensing element and the adhesive such that the stresses resulting from the difference in thermal expansion between the pressure sensing element and the adhesive are isolated by the glass pedestal. The glass pedestal and the pressure sensing element have slightly different coefficients of thermal expansion, and therefore expand and contract at a lower different rate when exposed to varying temperatures. The glass pedestal essentially acts as a buffer to isolate the stresses resulting from the different expansion and contraction rates between the glass pedestal and the adhesive.

An example of the pressure sensor discussed above is shown in FIGS. 1-2B generally at 10. The sensor 10 includes a pressure sensing element 12, a glass pedestal 14, an adhesive 16, and a housing substrate 18. The pressure sensing element 12 shown in FIG. 1 is made from silicon, and is anodically bonded to the glass pedestal 14. The adhesive 16 is used to bond the glass pedestal 14 to the housing substrate 18.

Formed as part of the housing substrate 18 is a first aperture 20, and formed as part of the glass pedestal 14 is a second aperture 22, which is in substantial alignment with the first aperture 20. The second aperture 22 is in fluid communication with a cavity, shown generally at 24, where the cavity 24 is formed as part of the pressure sensing element 12. The pressure sensing element 12 includes four angular inner surfaces, where only a first angular inner surface 26 and a second angular inner surface 28 are depicted in FIG. 1, because FIG. 1 is a cross-sectional view. Each of the four angular inner surfaces terminates into a bottom surface 30, which is part of a diaphragm 32. The pressure sensing element 12 also includes a top surface 34, and there is a picture frame transducer or picture frame Wheatstone bridge 36 doped onto the top surface 34 of the pressure sensing element 12. At least a thermal oxide layer and passivation layers are formed to protect the circuitry. The picture frame Wheatstone bridge 36 is formed by four p− piezoresistors 36A-36D as shown in FIG. 2B. The four piezoresistors 36A-36D may also be formed as a distributed Wheatstone bridge 38A-38D as shown in FIG. 3 for pressure sensing.

The diaphragm 32 is relatively thin, and the thickness of the diaphragm 32 depends upon the pressure range. The diaphragm 32 deflects upwardly and downwardly in response to pressure applied to the bottom surface 30, and the top surface 34 of the diaphragm 32. The pressure in the cavity 24 changes as a result of a pressure change of fluid flowing into and out of the apertures 20,22.

The deflections in the top surface 34 also deform the picture frame Wheatstone bridge 36, which is doped onto the top surface 34 of the pressure sensing element 12. The pressure sensing element 12 is made of a single crystalline silicon (Si). On the top of the pressure sensing element 12, four p− piezoresistors 36A-36D are formed and connected to each other by p+ interconnectors 40 to form the picture frame Wheatstone bridge 36 for pressure sensing as shown in FIGS. 2A-2B.

Merriam-Webster's Collegiate Dictionary 11$^{th}$ Edition defines a Wheatstone bridge as an electrical bridge consisting of two branches of a parallel circuit joined by a galvanometer and used for determining the value of an unknown resistance in one of the branches. As used herein, the term Wheatstone bridge refers to the circuit topology shown in FIG. 2A-2B, namely the parallel connection of two series-connected resistors.

FIGS. 2A-2B represent a top view of the piezoresistive pressure sensing element 12 with the picture frame Wheatstone bridge 36, which is doped on the diaphragm 32. The diaphragm 32 has dimensions of 780 μm×780 μm. The thickness of the diaphragm 32 is generally in the range of about 5 μm to 20 μm, and as shown in FIGS. 2A-2B, is about 9 μm. The picture frame Wheatstone bridge 36 is processed using conventional techniques to form four resistors 36A-36D on the top surface of the pressure sensing element 12. The resistors 36A-36D are formed of a p− material, embodiments of which are well-known to those of ordinary skill in the semiconductor art. Electrical interconnects 40 made of p+material connected to the bottom of bond pads 42A-42D are also formed on the top surface 34 of the pressure sensing element 12. Each interconnect 40 provides an electrical connection between two resistors in order to connect the resistors to each other to form a piezoresistive Wheatstone bridge circuit.

The four interconnects 40 are shown as part of the pressure sensing element 12. Each interconnect 40 extends outwardly from a point or node 44 between two of the four resistors 36 next to each other, and connects to the bottom of a metal bond pad 42. Each bond pad 42 is located near a side 46 of the top surface 34 of the pressure sensing element 12. Each interconnect 40 thus terminates at and connects to a bond pad 42.

FIG. 2A also shows an orientation fiducial 48 on the top surface 34. The fiducial 48 is a visually perceptible symbol or icon the function of which is simply to enable the orientation of the pressure sensing element 12.

Each bond pad 42 has a different label or name that indicates its purpose. The first bond pad 42A and the second bond pad 42B receive an input or supply voltage for the Wheatstone bridge circuit. Those two bond pads 42A,42B are denominated as $V_p$ and $V_n$, respectively. The other two bond pads 42C,42D are output signal nodes denominated as $S_p$ and $S_n$, respectively.

Many attempts have been made to simplify the construction of this type of pressure sensor 10 by eliminating the glass pedestal 14, and directly connecting the pressure sensing element 12 to the housing substrate 18 with the adhesive 16. However, the difference in thermal expansion between the adhesive 16 and the pressure sensing element 12 has resulted"

in unwanted stresses being applied to the pressure sensing element 12, which then disrupt each of the resistors 36A-36D, causing an inaccurate pressure reading by the pressure sensing element 12.

More particularly, both experimental measurement and computer simulations of the structure depicted in FIGS. 1-2B show that connecting the pressure sensing element 12 directly to the housing substrate 18 creates offset voltage output and its variation over an operating temperature range due to asymmetrical thermal stresses on the resistors 36A-36D. Elimination of the glass pedestal 14 causes one of the resistors 36A through 36D to deform or stressed, or to change its resistance value asymmetrically with respect to the other resistors leading to an offset voltage output variation in an operating temperature range in the output of the pressure sensing element 12.

The offset voltage output variation over an operating temperature is called temperature coefficient of offset voltage output (TCO) and defined as follows:

$$TCO = (Vo\ at\ 150°\ C. - Vo\ at\ -40°\ C.)/190°\ C.$$

Where Vo at 150° C.: offset voltage output at 150° C. without pressure applied

Vo at −40° C.: offset voltage output at −40° C. without pressure applied

The pressure sensing element 12 is commonly used with an application-specific integrated circuit (ASIC). The ASIC is, among other things, used for amplifying and calibrating the signal received from the pressure sensing element 12. It is desirable to keep the TCO between −50 uV/° C. and 50 uV/° C. so the ASIC is better able to handle any thermal noise.

The high TCO is difficult for an ASIC to compensate, especially when the adhesive 16 is not symmetrically dispensed. If the adhesive is not symmetrically dispensed, this can further reduce the accuracy of the sensor. The stress difference in the X and Y directions on each of the four resistors is amplified, thus the offset voltage outputs increase, as well as the TCO. That is why the glass pedestal 14 shown in FIG. 1 is used to isolate the thermal stresses. In order to reduce cost and simplify the manufacturing process, it is desirable to eliminate the glass pedestal. A pressure sensing element without a glass pedestal also improves wire bonding stability and reliability. Therefore, there is a need for a type of pressure sensor which does not have a glass pedestal, but has a low TCO noise.

SUMMARY OF THE INVENTION

In some embodiments, a pressure sensor is designed to reduce or eliminate thermally induced stresses or thermal noise, such as temperature offset voltage output. The pressure sensor includes a pressure sensing element having a diaphragm, and a cavity formed as part of the pressure sensing element, where the cavity receives a fluid such that the diaphragm at least partially deflects. The pressure sensor also includes a plurality of piezoresistors connected to the pressure sensing element, which are operable to generate a signal based on the amount of deflection in the diaphragm. A top surface is formed as part of the pressure sensing element, and the plurality of piezoresistors are doped to the top surface. A plurality of outer surfaces is also formed as part of the pressure sensing element, such that each of the plurality of outer surfaces terminates into the top surface. At least one substrate is operable for supporting the pressure sensing element.

At least one trench is integrally formed as part of the pressure sensing element, and an adhesive connects the pressure sensing element to the at least one substrate such that at least a portion of the adhesive is disposed in the trench and redistributes thermally induced stresses on the piezoresistors such that the thermally induced stresses are substantially eliminated.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
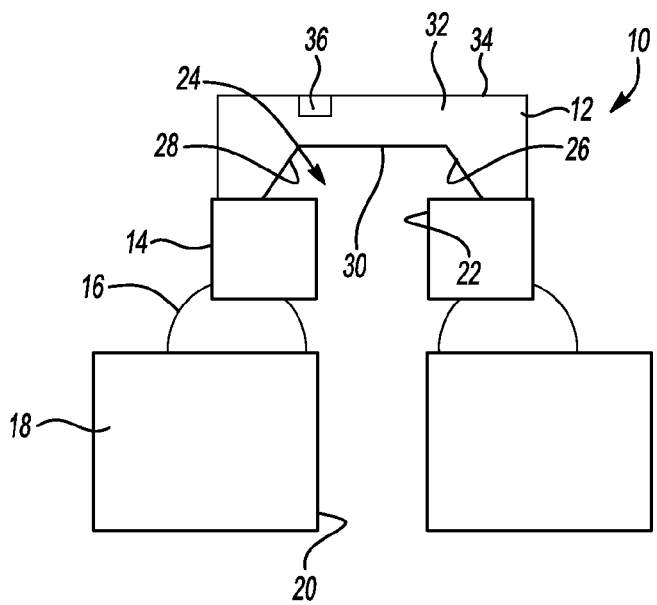
FIG. 1 is a cross-sectional view of a prior art pressure sensor.

The following description of the preferred embodiment(s) is merely exemplary in nature and is in no way intended to limit the invention, its application, or uses.

A pressure sensor according to embodiments of the present invention is shown in FIGS. 4-11, generally at 100. The sensor 100 includes a pressure sensing element 112, an adhesive 114, and a housing substrate 116. The pressure sensing element 112 shown in FIGS. 4-7 is made from silicon, and is connected to the housing substrate 116 using the adhesive 114.

Formed as part of the housing substrate 116 is an aperture 118. The aperture 118 is in fluid communication with a cavity, shown generally at 120, where the cavity 120 is formed as part of the pressure sensing element 112. In one embodiment, the cavity 120 is formed using a dry etch, deep reactive ion etch (DRIE), but it is within the scope of the invention that other processes may be used. The pressure sensing element 112 includes a plurality of substantially vertical inner surfaces 122A-122D. Each of the inner surfaces 122A-122D terminates into a bottom surface 124, which is part of a diaphragm 126. Each of the inner surfaces 122A-122D is substantially perpendicular to the diaphragm 126. The pressure sensing element 112 also includes a top surface 128, and there is a picture frame Wheatstone bridge, shown generally at 36, doped onto the top surface 128 of the pressure sensing element 112, which is the same picture frame Wheatstone bridge 36 shown in FIGS. 2A-2B.

Figure 4:
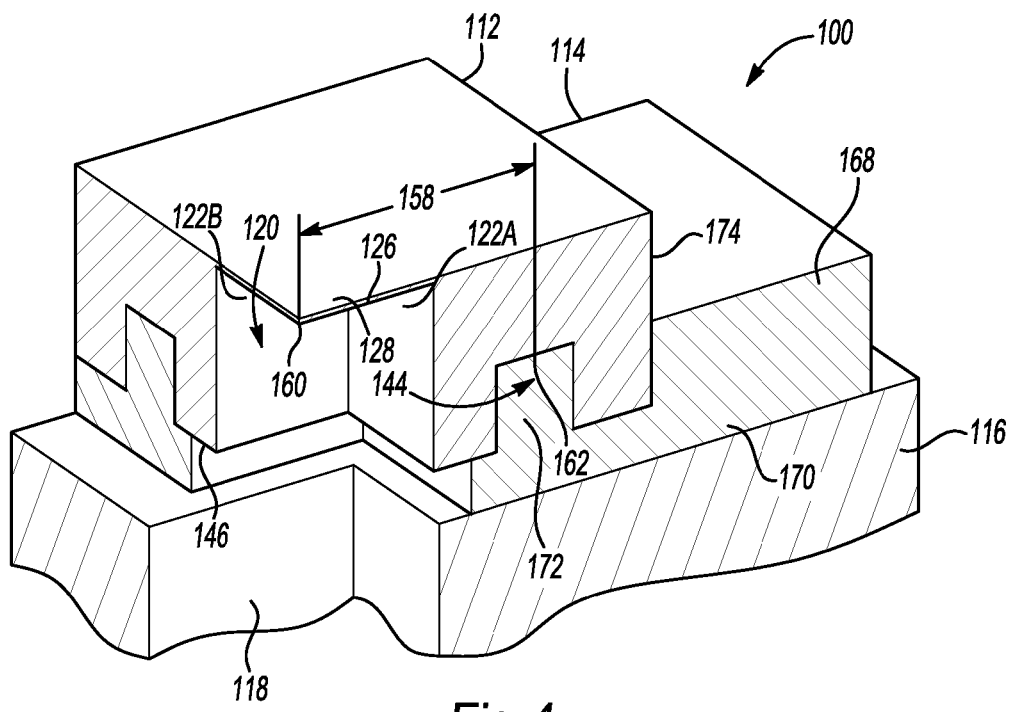
FIG. 4 is a perspective view of a section of a semiconductor sensing device, according to embodiments of the present invention.
Figure 5:
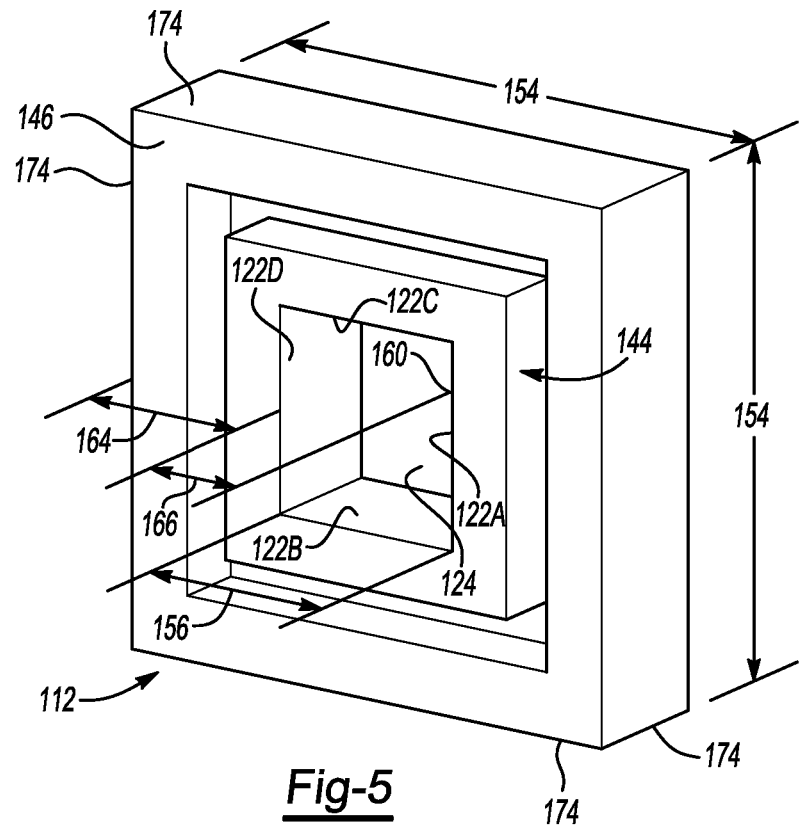
FIG. 5 is a perspective bottom view of a pressure sensing element used as part of a semiconductor sensing device, according to embodiments of the present invention.
Figure 6:
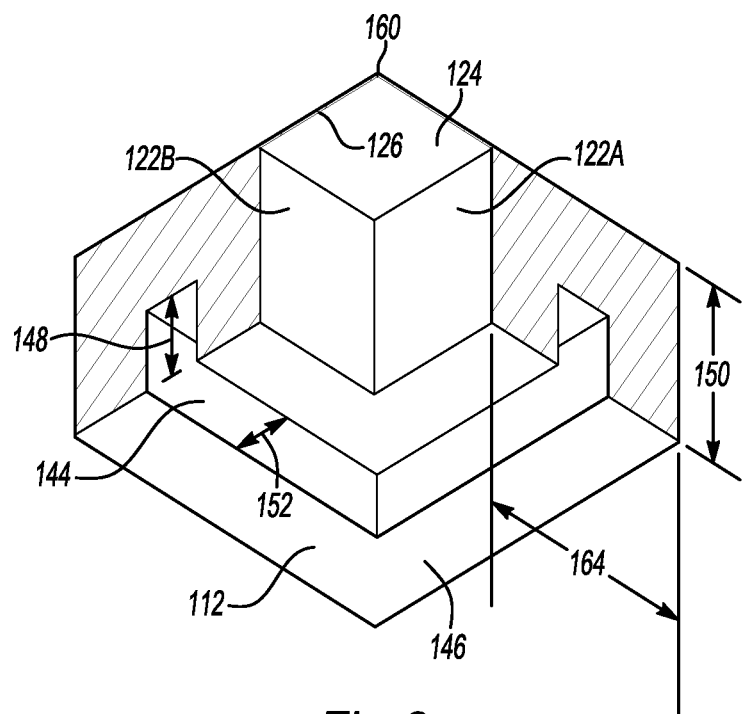
FIG. 6 is a perspective bottom view of a section of a pressure sensing element used as part of a semiconductor sensing device, according to embodiments of the present invention.
Figure 7:
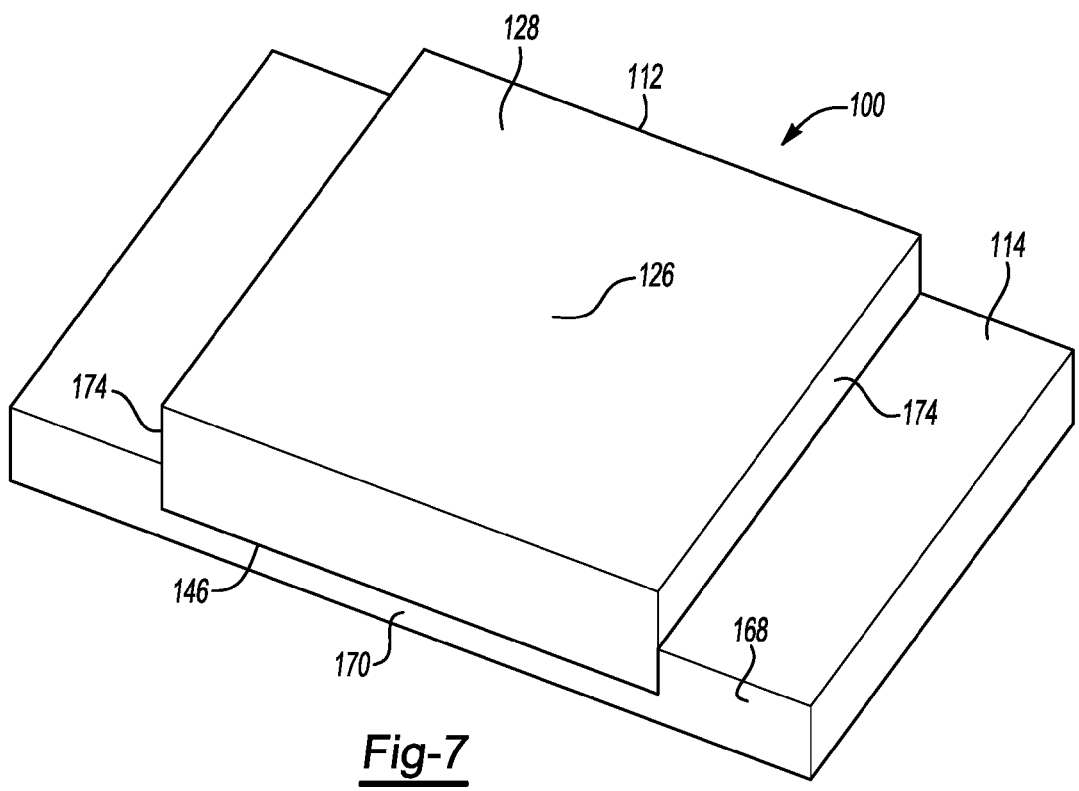
FIG. 7 is a perspective view of a pressure sensing element and an adhesive used as part of a semiconductor sensing device, according to embodiments of the present invention.

The diaphragm 126 is relatively thin, and the thickness of the diaphragm 126 depends upon the pressure range. The diaphragm 126 deflects upwardly and downwardly in response to pressure applied to the bottom surface 124, and the top surface 128 of the diaphragm 126 deflects in response to pressure changes in the cavity 120 and on the top surface 128 as shown in FIG. 4. The pressure in the cavity 120 changes as a result of a pressure change of a fluid in the aperture 118.

Figure 2A:
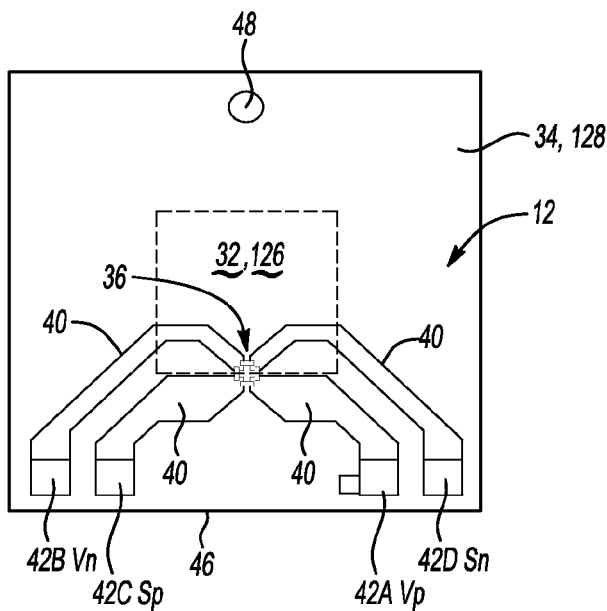
FIG. 2A is a top view of a piezoresistive pressure sensing element used with a prior art pressure sensor.
Figure 2B:
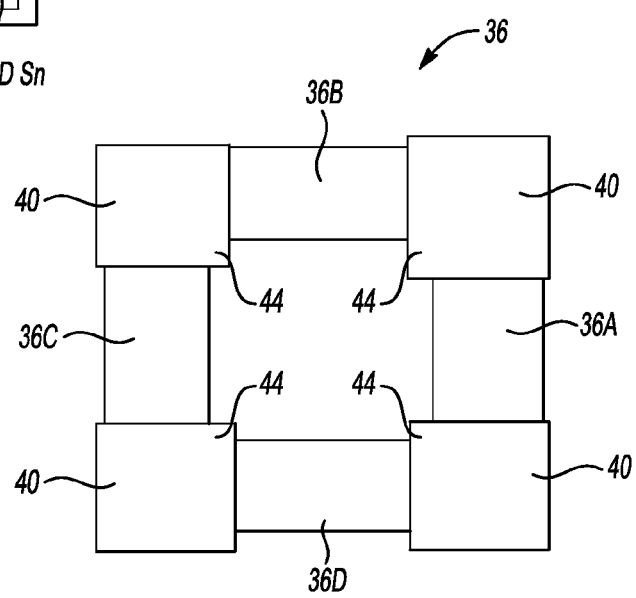
FIG. 2B is an enlarged view of the pressure sensing element shown in FIG. 2A, which shows a picture frame Wheatstone bridge.
Figure 3:
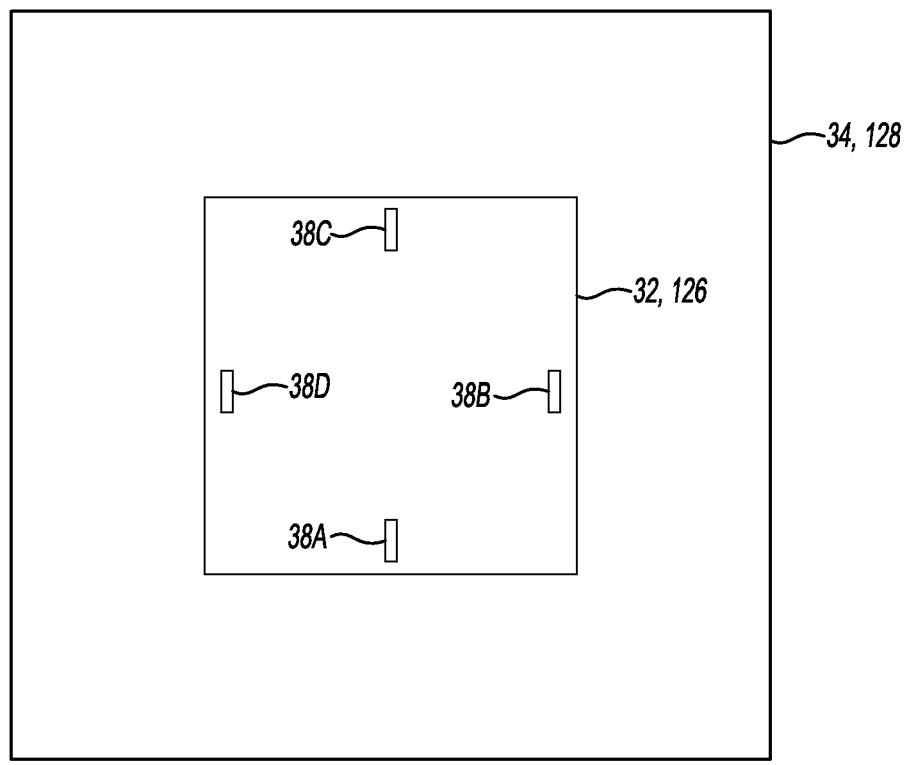
FIG. 3 is a top view of a distributed Wheatstone bridge on the pressure sensing element.

The deflections in the top surface 128 also deform the picture frame Wheatstone bridge 36. The deflections of the top surface 128 of the diaphragm 126 deform the picture frame Wheatstone bridge 36 doped onto the top surface 128 of the pressure sensing element 112, which is made of a single crystalline silicon (Si) in a similar manner to the pressure sensing element 12 shown in FIG. 1. On the top surface 128 of the pressure sensing element 112, four piezoresistors are formed and connected to each other to form a Wheatstone bridge for pressure sensing as shown in FIGS. 2A and 2B. In this embodiment, the Wheatstone bridge is a picture frame Wheatstone bridge 36, and is configured as shown in FIG. 2A-2B, and all four resistors 36A-36D are located near one side of the diaphragm 126. However, it is within the scope of the invention that the Wheatstone bridge may be configured as a distributed Wheatstone bridge circuit, shown in FIG. 3, where each resistor 38A-38D is located near each side of the diaphragm 126.

In this embodiment, the Wheatstone bridge still includes the plurality of resistors 36A-36D, the plurality of electrical interconnects 40, the plurality of bond pads 42, and the nodes 44. With this embodiment, the bond pads 42 are again located near a side 46 of the top surface 128 of the pressure sensing element 112. The Wheatstone bridge in this embodiment also includes a fiducial 48 which used for orienting the Wheatstone bridge during assembly.

A Wheatstone bridge circuit has two input nodes and two output nodes. The transfer function, which is the ratio of the output voltage to the input voltage, can be expressed as shown in Eq. 1 below.

$$\frac{V_{out}}{V_{in}} = \left(\frac{R_3}{R_3 + R_4} - \frac{R_2}{R_1 + R_2}\right) \quad (1)$$

Rearranging the transfer function terms provides an equation for the output voltage $V_{out}$ as a function of the input voltage $V_{in}$ and values of the resistors in the Wheatstone bridge. Equation 2 below thus expresses the output voltage as a function of the input voltage and the values of the resistors that comprise the Wheatstone bridge circuit.

$$V_{out} = \left(\frac{R_3}{R_3 + R_4} - \frac{R_2}{R_1 + R_2}\right)V_{in} \quad (2)$$

It can be seen from Eq. 2 that the output voltage changes as the resistors' values change induced by pressure, temperature change, thermal mismatch, etc. One type of thermal mismatch exists between the pressure sensing element 112 and the housing substrate 116, which has an effect on the output voltage.

Equation 3 below expresses the output voltage as a function of the fluctuations in resistance values.

$$V_{out} = \sum_{i=1}^{4}\left(\frac{\partial V_{out}}{\partial R_i}\right)\Delta R_i \quad (3)$$

Expanding Equation 3 into Equation 4 below shows that $V_{out}$ will vary with changes in each of the resistors R1 through R4.

$$V_{out} = \frac{V_{in}}{4}\left(\frac{\Delta R_1}{R_1} - \frac{\Delta R_2}{R_2} + \frac{\Delta R_3}{R_3} - \frac{\Delta R_4}{R_4}\right) \quad (4)$$

For a piezoresistive device, the ratio of the resistance change versus the resistance for each resistor can be expressed as follows:

$$\frac{\Delta R_i}{R_i} = \frac{\pi_{44}}{2}(\sigma_i^L - \sigma_i^T)$$

where
$\sigma_i^L$: longitudinal stress on the resistor i
$\sigma_i^T$: transverse stress on the resistor i
and the value of piezoresistive coefficient, $\pi_{44}$ is approximately 1.381/GPa with a boron doping density of 1.8E15/cm^3.

Equation 4 shows that the value for the ratio of the resistance change versus the resistance for each resistor is dependent on the longitudinal and transverse stresses on each resistor. If the longitudinal stresses on Resistor 1 and 3 are aligned to be perpendicular to the edge of the diaphragm, then the transverse stresses on Resistor 2 and 4 is also perpendicular to the edge of the diaphragm. The stress perpendicular to the edge of the diaphragm is denominated as Sxx. In this condition, the transverse stresses on Resistor 1 and 3 and the longitudinal stresses on Resistor 2 and 4 will be parallel to the edge of the diaphragm. The stress parallel to the edge of the diaphragm is denominated as Syy. Therefore, Equation 4 can be re-written as Equation 5 below.

$$V_{out} = \frac{\pi_{44}V_{in}}{2} \times \frac{1}{4}\sum_{i=1}^{4}(Syy - Sxx)_i \quad (5)$$

$V_{out}$ is thus a function of the sum of the differential stresses, (Sxx−Syy) on all the four resistors. According to Equation 5, when the pressure sensor device is under the pressure, the stress perpendicular to the diaphragm on each resistor, Sxx is higher than the stress parallel to the diaphragm on each resistor, Syy. Therefore the pressure sensor device has a high sensitivity. In order to minimize the noise, however, it is desirable to keep the voltage output, or the offset voltage output in this condition as low as possible, and preferably zero for the noise induced by the thermal stress. Based on Equation 5, it is apparent that if thermally-induced stresses Sxx and Syy can be equalized or the sum of (Sxx−Syy) can be reduced to zero, the offset voltage output becomes zero due to the cancellation of the stresses. Once the offset voltage outputs are reduced to approximately zero at different temperature levels, the TCO is essentially zero.

The operating temperature range of the sensor 100 is between about −40° C. and about +150° C. The difference in the coefficient of thermal expansion between the pressure sensing element 112, the adhesive 114, and the housing substrate 116 creates an imbalance among the stresses applied to the various resistors 36. This imbalance is corrected by a trench, shown generally at 144. Because of the trench 144, the sensor 100 also does not require the glass pedestal 14 shown in FIG. 1, reducing the overall cost of the sensor 100. The trench 144 extends along a base surface 146 of the pressure sensing element 112. The depth 148 of the trench 144 is generally from about one-tenth to one-half of the height 150 of the pressure sensing element 112, and is preferably about one-third to one-half of the height 150 of the pressure sensing element 112. The height 150 of the pressure sensing element 112 is about 0.525 mm, and the width 152 of the trench 144 is generally in the range of 0.1 to 0.5 mm, and is preferably about 0.225 mm. The pressure sensing element 112 is essentially square-shaped, and the width 154 of each side of the pressure sensing element 112 is about 2.06 mm, and the width 156 of each side of the diaphragm 126 is about 0.780 mm.

The trench 144 is located at a distance 158 from the center 160 of the pressure sensing element 112. The distance 158 is calculated from the center 162 of the trench 144 to the center 160 of the pressure sensing element 112. The distance 158 from the center 160 of the pressure sensing element 112 to the center 162 of the trench 144 is generally about 0.575 mm to 0.800 mm. The overall width 164 of the bottom surface 146 is about 0.640 mm, and is located at a distance 166 of about 0.390 mm from the center 160 of the pressure sensing element 112.

The inner surfaces 122A-122D being substantially vertical provide for the pressure sensing element 112 to be made smaller compared to the pressure sensing element 12 shown in FIG. 1, which is an improvement over the design which includes the angled surfaces 26,28 shown in FIG. 1. The reduced size of the pressure sensing element 112 allows for installation and use in a wider arrangement of locations, such as location where space or weight is limited. The incorporation of the trench 144 relaxes the stiffness of the silicon pressure sensing element 112, redistributes the thermal stresses induced by the adhesive 114, and significantly compresses the resistors 36A-36D in the direction perpendicular to the diaphragm 126 (Sxx), while gently compresses the resistors 36A-36D in the direction parallel to the diaphragm 126 (Syy). The diaphragm 126, especially in the area of the picture frame Wheatstone bridge 36, experiences more equally planar compressive stresses in both the X and Y directions.

During assembly, the pressure sensing element 112 is connected to the housing substrate 116 using the adhesive 114. As the pressure sensing element 112 is placed onto the adhesive 114, the adhesive 114 fills the trench 144 and at least partially surrounds two of the substantially vertical outer surfaces 174 on two opposite sides of the pressure sensing element 112. The adhesive 114 provides a secure connection between the housing substrate 116 and the pressure sensing element 112. During assembly, the adhesive 114 is deformable and when assembled, the adhesive 114 has an outer fillet portion 168, a base portion 170, and an inner fillet portion 172. The portion of the adhesive 114 that surrounds two of the outer surfaces 174 is the outer fillet portion 168, best shown in FIGS. 4 and 7 for one of the worst TCO cases.

When the sensor 100 is used in operation, and exposed to various temperatures, the pressure sensing element 112, the adhesive 114, and the housing substrate 116 have different coefficients of thermal expansion, and therefore expand and contract at different rates. The trench 144 is used to offset the various stresses which result from the difference in rates of thermal expansion of the pressure sensing element 112, the adhesive 114, and the housing substrate 116.

Figure 8:
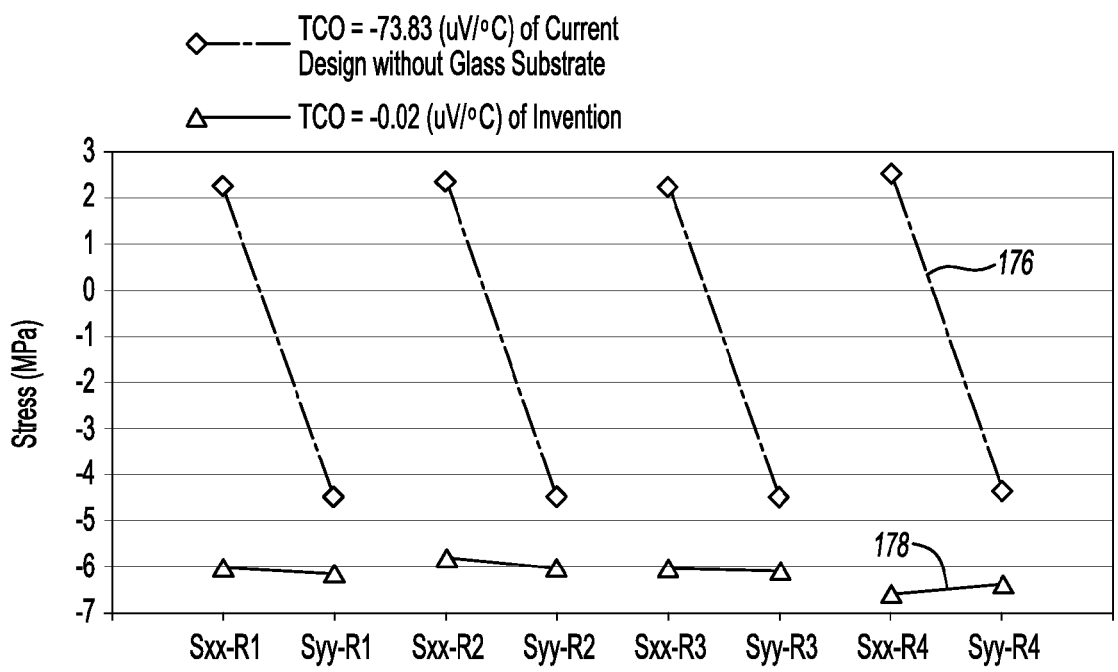
FIG. 8 is a graph representing the comparison and improvement in reduction of thermal stress difference in the X and Y directions on each resistor between a prior art semiconductor sensing device and a semiconductor sensing device, according to embodiments of the present invention.

FIG. 8 shows a comparison of the stress components Sxx and Syy between a pressure sensor having the trench 144, and a pressure sensor which does not have the trench 144. In FIG. 8, reference numeral 176 shows the stress components Sxx and Syy on each of the four resistors 36 without a trench 144 added to the pressure sensing element 112. Resistors 36A-36D which are named R1, R2, R3, and R4 respectively, (Syy−Sxx)$_1$ and (Syy−Sxx)$_3$ as well as both (Syy−Sxx)$_2$ and (Syy−Sxx)$_4$ are all negative. Thus the sum of all small (Syy−Sxx) on all four resistors is greatly negative, generating a TCO of −73.83 uV/° C.

Experimental and computer simulations show that the TCO is approximately proportional to the offset voltage output at −40° C. In order to reduce or minimize the TCO, it is important to reduce or minimize the offset voltage output at −40° C. Numeral 178 in FIG. 8 shows that all (Syy−Sxx) on resistors R1 through R3 36A through 36C turn into small negative from positive, and the (Syy−Sxx) on resistor R4 36D drops but still remains positive. The sum of all (Syy−Sxx) is virtually cancelled out and so the offset voltage output at −40° C. is minimized to a small negative value. TCO is thus reduced to a small negative value at −0.02 uV/° C.

Figure 9:
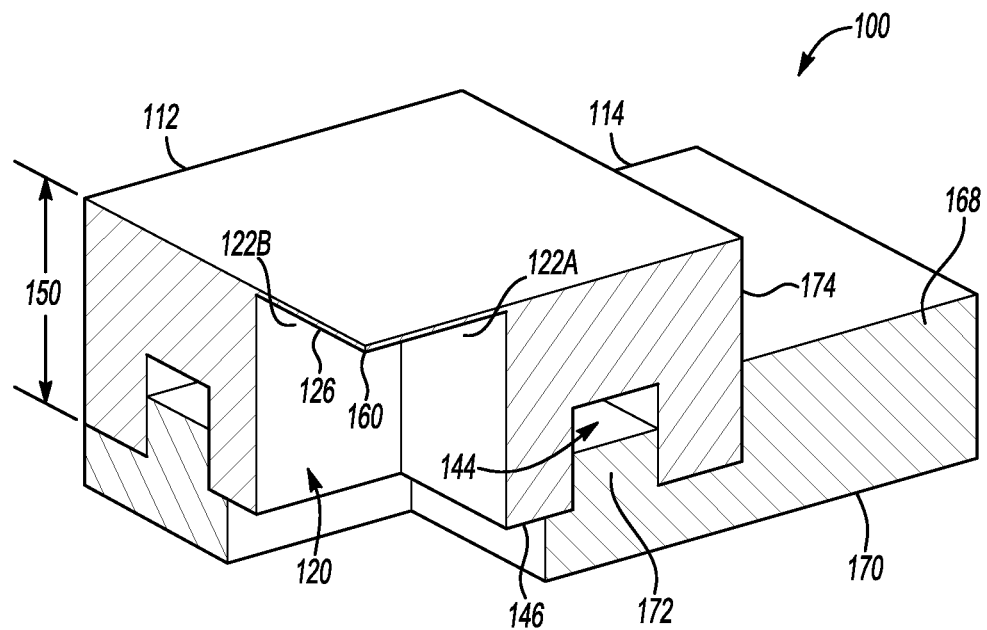
FIG. 9 is a perspective view of a section of a semiconductor sensing device, according to another embodiment of the present invention.

The pressure sensing element 112 is also able to compensate for different variations as well. Referring to FIG. 9, the pressure sensing element 112 is shown with the trench 144. However, the adhesive 114 has not completely filled the trench 144, compared to the completely filled trench 144 shown in FIG. 4. However, even if the trench 144 is not completely filled with the adhesive 144, the trench 144 being partially filled with adhesive 114 shows an improvement over the prior art pressure sensing element 12 which has no trench. The pressure sensing element 112 shown in FIG. 9 has a TCO of −32.45 uV/° C.

Figure 10:
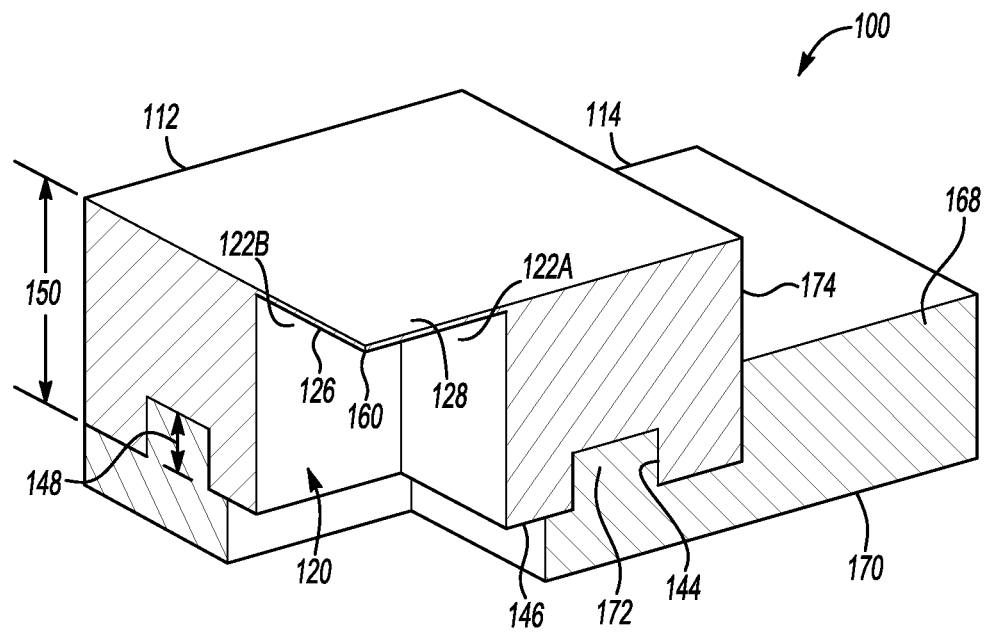
FIG. 10 is a perspective view of a section of a semiconductor sensing device, according to another embodiment of the present invention.

An alternate embodiment of the present invention is shown in FIG. 10, with like numbers referring to like elements. In this embodiment, the depth 148 of the trench 144 is reduced, and the pressure sensing element 112 has a TCO of −13.53 uV/° C., which is still an improvement over a pressure sensing element which does not have a trench 144.

Figure 11:
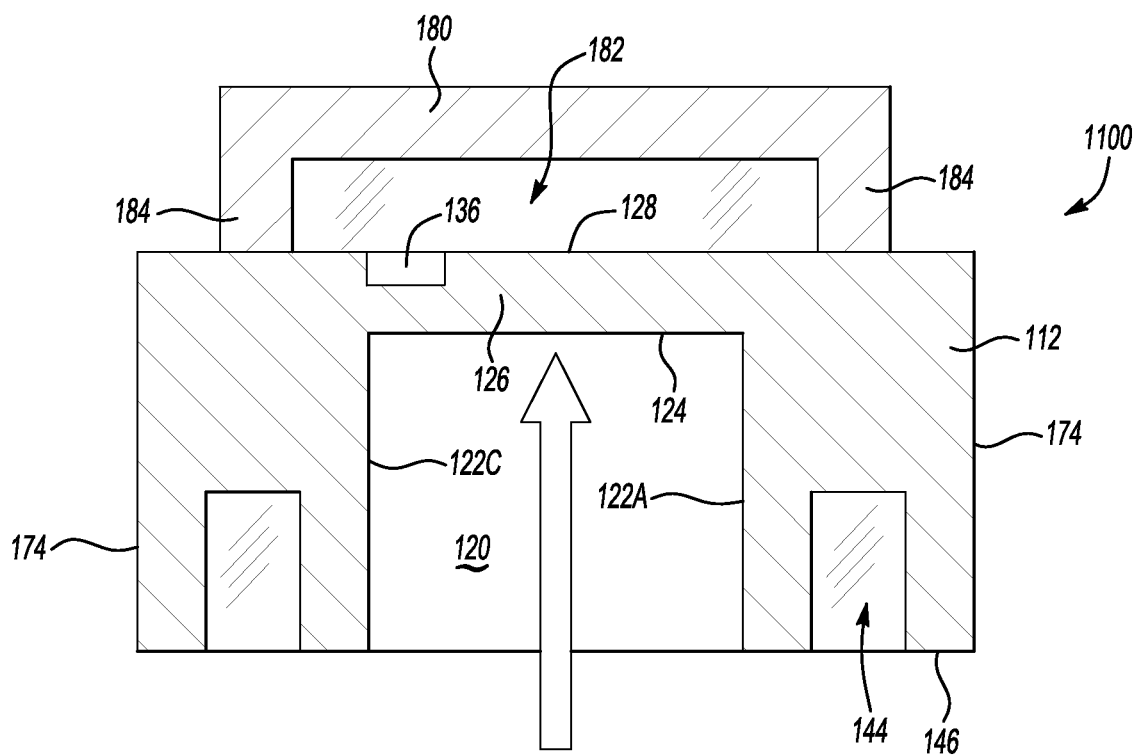
FIG. 11 is a cross-sectional view of a semiconductor sensing device for backside absolute pressure sensing, according to another embodiment of the present invention.

Another alternate embodiment of the present invention is shown at 1100 in FIG. 11, with like numbers referring to like elements. In this embodiment, a cap 180 is attached to the top surface 128 of the pressure sensing element 112. In some embodiments, the cap 180 may be made of silicon or glass, such as borosilicate glass. In this embodiment, the cap 180 is made of silicon and fusion bonded to the top surface 128 of the pressure sensing element 112. However, if the cap 180 were made of glass, the cap 180 would be anodically bonded to the top surface 128 of the pressure sensing element 112.

The cap 180 includes a chamber, shown generally at 182, located between sidewalls 184. The cap 180 is bonded to the top surface 128 of the pressure sensing element 112 such that the chamber 182 is a vacuum chamber, which functions as a zero pressure reference when the diaphragm 126 is exposed to the environment. This allows the pressure sensor 1100 shown in FIG. 11 to measure an absolute pressure, whereas the pressure sensor 100 shown in the previous embodiments measure differential pressure. The length and width of the chamber 182 is at least as large as the length and width of the diaphragm 126. The cap 180 isolates the diaphragm 126 from the media from the top side and protects the diaphragm 126 from harsh environments, reducing the probability of damage occurring to the circuitry on the top surface 128 of the pressure sensing element 112.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus, comprising:
a pressure sensing element, including:
  a cavity formed into a base surface of the pressure sensing element;
  a diaphragm defined at least in part by the cavity;
  a plurality of piezoresistors on the diaphragm;
  at least one trench surrounding the cavity and formed in the base surface;
  a top surface; and
  at least one outer surface terminating into the top surface and the base surface.

2. The apparatus of claim 1, further comprising:
at least one substrate; and
an adhesive which connects the substrate to the base surface such that the at least one trench receives at least a portion of the adhesive.

3. The apparatus of claim 2, the adhesive further comprising:
  a base portion;
  an outer fillet portion integrally formed with the base portion, the outer fillet portion adjacent the at least one outer surface when the pressure sensing element is connected to the at least one substrate; and
  an inner fillet portion integrally formed with the base portion, the inner fillet portion substantially disposed in the trench when the pressure sensing element is connected to the at least one substrate.

4. The apparatus of claim 2, wherein the portion of the adhesive disposed in the at least one trench redistributes the thermally induced stresses on the pressure sensing element such that the effect of the thermally induced stresses or thermal noise is substantially eliminated.

5. The apparatus of claim 1, wherein the at least one trench is of a depth that is generally about one-tenth to one-half of the overall height of the at least one substrate.

6. The apparatus of claim 5, wherein the at least one trench is of a depth that is about one-third to one-half of the overall height of the at least one substrate.

7. The apparatus of claim 1, further comprising:
a cap connected to the top surface; and
a chamber integrally formed as part of the cap such that the chamber is at least partially evacuated.

8. The apparatus of claim 7, wherein the cap is made of a borosilicate glass.

9. The apparatus of claim 7, wherein the cap is made of silicon.

10. The apparatus of claim 1, wherein the plurality of piezoresistors are configured to be a picture frame Wheatstone bridge.

11. The apparatus of claim 1, wherein the plurality of piezoresistors are configured to be a distributed Wheatstone bridge.

12. The apparatus of claim 1, further comprising:
  at least one inner surface formed as part of the pressure sensing element such that the at least one inner surface is substantially perpendicular to the diaphragm; and
  at least one base surface formed as part of the pressure sensing element such that the base surface terminates into the at least one inner surface, the at least one trench formed as part of the base surface.

13. The apparatus of claim 12, further comprising:
  a cavity formed as part of the pressure sensing element; and
  a bottom surface formed as part of the pressure sensing element, the at least one inner surface terminating into the bottom surface such that the at least one inner surface and the bottom surface form at least a portion of the cavity, the bottom surface forming at least a portion of the diaphragm;
  wherein a fluid in the cavity applies pressure to the bottom surface to deflect the bottom surface.

14. The apparatus of claim 1, further comprising:
  a cap connected to the pressure sensing element; and
  a chamber integrally formed as part of the cap such that the chamber is partially evacuated.

15. The apparatus of claim 14, wherein the cap is made of a borosilicate glass.

16. The apparatus of claim 14, wherein the cap is made of silicon.

17. A pressure sensor, comprising:
  a pressure sensing element having a diaphragm;
  a cavity formed as part of the pressure sensing element;
  a plurality of piezoresistors connected to the pressure sensing element;
  a top surface formed as part of the pressure sensing element such that at least a portion of the top surface is part of the diaphragm, the plurality of piezoresistors being on the top surface;
  a plurality of outer surfaces formed as part of the pressure sensing element, each of the plurality of outer surfaces terminating into the top surface;
  a bottom surface formed as part of the pressure sensing element, each of the plurality of outer surfaces terminating into the bottom surface;
  a plurality of inner surfaces formed as part of the pressure sensing element, the plurality of inner surfaces terminating into the bottom surface such that the plurality of inner surfaces and the bottom surface form at least a portion of the cavity;
  a base surface formed as part of the pressure sensing element, the base surface terminating into the plurality of inner surfaces, and the plurality of outer surfaces;
  at least one trench integrally formed as part of the base surface;
  at least one substrate configured to support the pressure sensing element; and
  an adhesive connecting the pressure sensing element to the at least one substrate;
  wherein at least a portion of the adhesive is disposed in the at least one trench.

18. The pressure sensor of claim 17, the adhesive further comprising:
  a base portion;

an outer fillet portion integrally formed with the base portion, the outer fillet portion adjacent the at least one outer surface when the pressure sensing element is connected to the at least one substrate; and an inner fillet portion integrally formed with the base portion, the inner fillet portion substantially disposed in the trench when the pressure sensing element is connected to the at least one substrate.

19. The pressure sensor of claim 17, wherein the at least one trench is of a depth that is generally about one-tenth to one-half of the overall height of the at least one substrate.

20. The pressure sensor of claim 19, wherein the at least one trench is of a depth that is about one-third to one-half of the overall height of the at least one substrate.

21. The pressure sensor of claim 17, further comprising:
a cap connected to the top surface; and
a chamber integrally formed as part of the cap such that the chamber is partially evacuated.

22. The apparatus of claim 21, wherein the cap is made of a borosilicate glass.

23. The apparatus of claim 21, wherein the cap is made of silicon.

24. The pressure sensor of claim 17, wherein the plurality of piezoresistors are configured to be a picture frame Wheatstone bridge.

25. The pressure sensor of claim 17, wherein the plurality of piezoresistors are configured to be a distributed Wheatstone bridge.

* * * * *